(12) United States Patent
Takeuchi

(10) Patent No.: US 9,057,744 B2
(45) Date of Patent: Jun. 16, 2015

(54) PROTECTIVE RELAYING DEVICE

(71) Applicant: Atsushi Takeuchi, Inzai (JP)

(72) Inventor: Atsushi Takeuchi, Inzai (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 391 days.

(21) Appl. No.: 13/687,019

(22) Filed: Nov. 28, 2012

(65) Prior Publication Data

US 2013/0090875 A1    Apr. 11, 2013

Related U.S. Application Data

(63) Continuation of application No. PCT/JP2011/060160, filed on Apr. 26, 2011.

(30) Foreign Application Priority Data

May 28, 2010   (JP) ................................. 2010-123521

(51) Int. Cl.
*G01R 17/12*   (2006.01)
*H02H 3/30*   (2006.01)

(52) U.S. Cl.
CPC .............. *G01R 17/12* (2013.01); *H02H 3/302* (2013.01)

(58) Field of Classification Search
CPC .... G01R 31/08; G01R 31/085; G01R 31/086; G01R 31/02; G01R 19/2513; G06F 19/00; H02H 7/261; H02H 7/263; H02H 7/26; H02H 1/0061; H02H 1/00; H02H 3/26; H02H 3/265; H02H 3/382

USPC .......... 702/58, 60, 66, 106; 324/76.52, 76.77, 324/418, 522
See application file for complete search history.

(56) References Cited

U.S. PATENT DOCUMENTS 4,612,594 A     9/1986   Yamaura et al. ................. 361/68
5,576,625 A *  11/1996   Sukegawa et al. ............ 324/424

FOREIGN PATENT DOCUMENTS

| CN | 1348243 A | 5/2002 |
|---|---|---|
| JP | 50-49645 A | 5/1975 |
| JP | 2007-68325 A | 3/2007 |
| WO | WO 2007/132551 A1 | 11/2007 |

OTHER PUBLICATIONS

English translation of the International Preliminary Report on Patentability issued Dec. 13, 2012 in PCT/JP2011/060160 filed Apr. 26, 2011.

(Continued)

*Primary Examiner* — Toan Le
(74) *Attorney, Agent, or Firm* — Oblon, McClelland, Maier & Neustadt, L.L.P.

(57) ABSTRACT

According to one embodiment, a protective relaying device includes a phase difference calculating unit configured to calculate a phase difference between a phase obtained by shifting a phase of first current data by 180°, and a phase of second current data, a setting unit configured to calculate a target value of elimination of a sampling synchronization error caused by a difference between a transmission delay time of up-transmission, and a transmission delay time of down-transmission on the basis of the phase difference, and to set the calculated target value, and a sampling synchronization control unit configured to carry out control of sampling synchronization such that a difference between a time TM and a time TF.

8 Claims, 11 Drawing Sheets

(56) References Cited

OTHER PUBLICATIONS

Written Opinion of the International Searching Authority issued Aug. 9, 2011 in PCT/JP2011/060160 filed Apr. 26, 2011 (submitting English translation only, previously filed Nov. 28, 2012).

International Search Report mailed Aug. 9, 2011 in PCT/JP2011/060160 filed Apr. 26, 2011 (with English translation).
International Written Opinion mailed Aug. 9, 2011 in PCT/JP2011/060160 filed Apr. 26, 2011.

\* cited by examiner

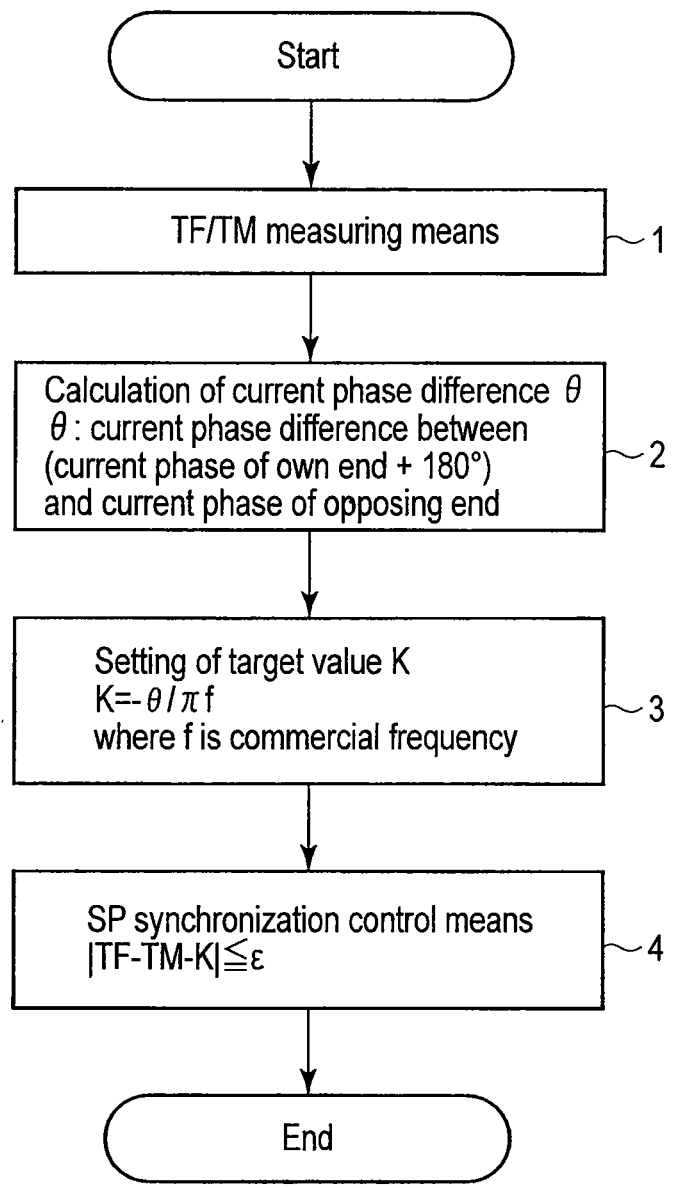
F I G. 1

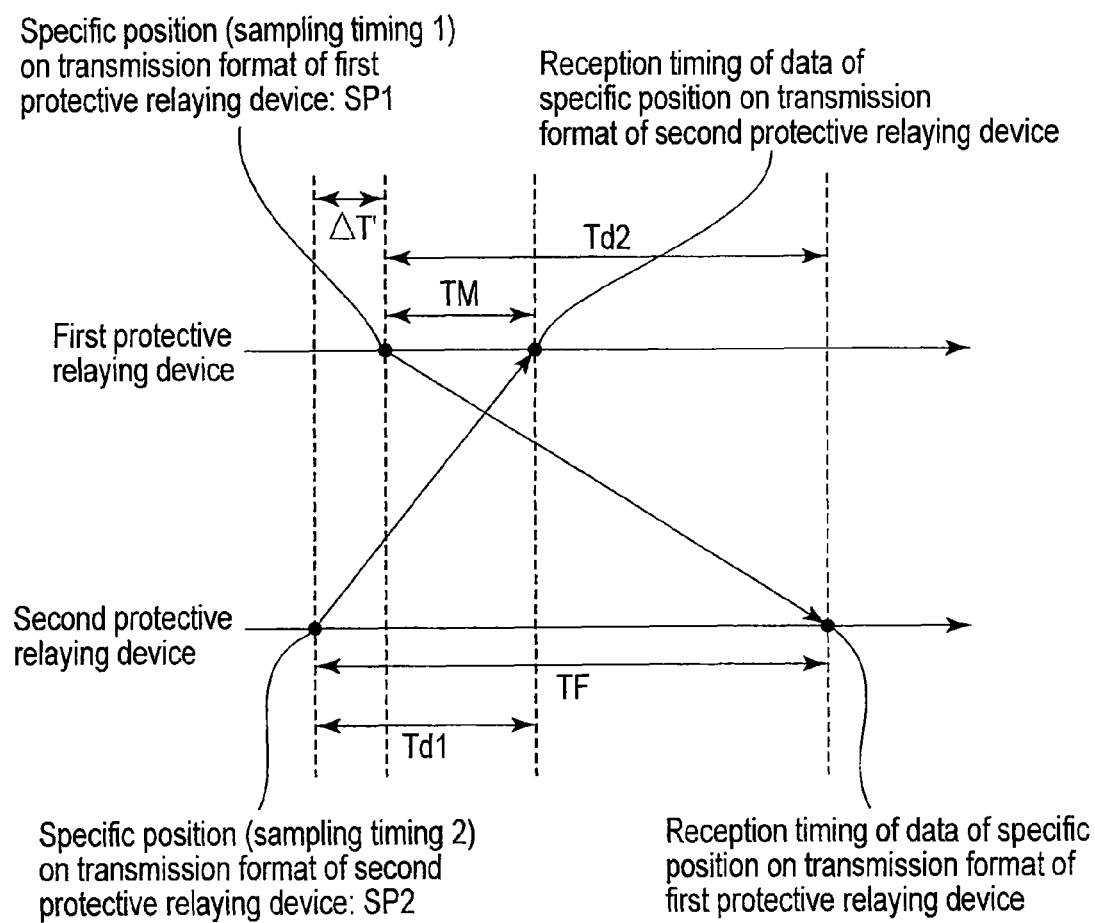
F I G. 2A

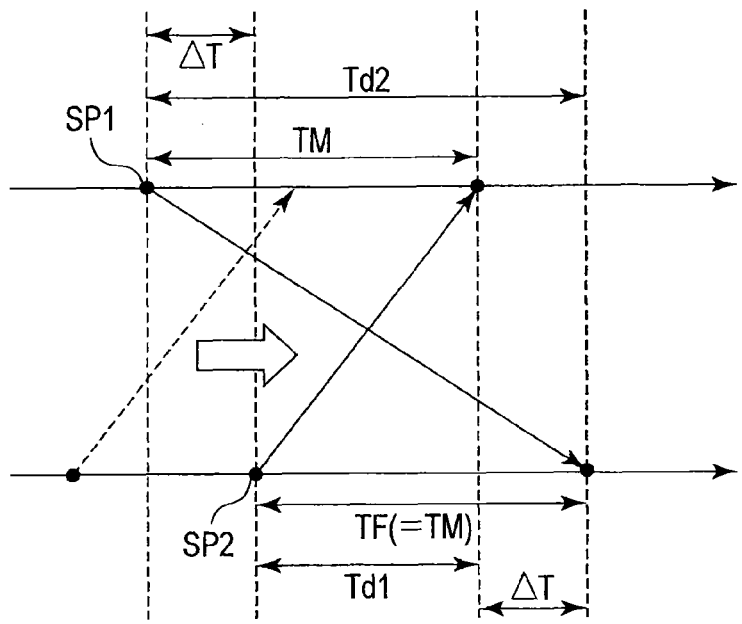
F I G. 2B
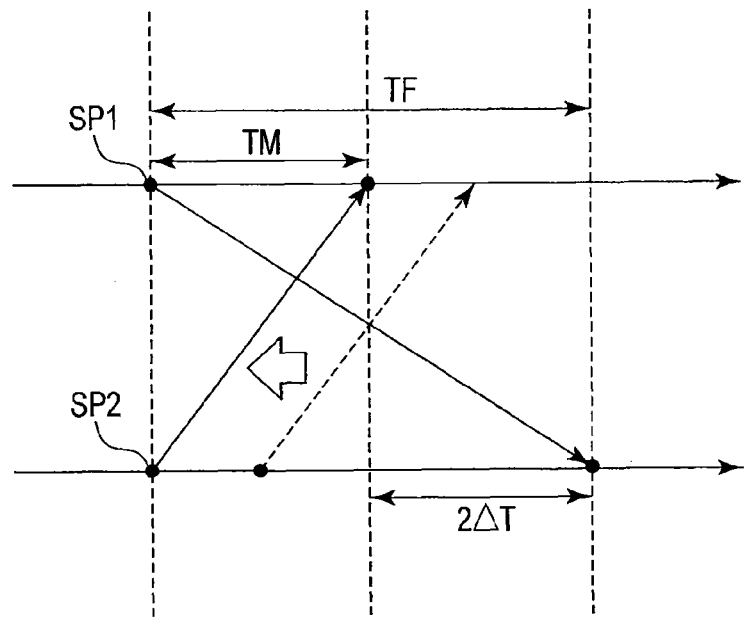
F I G. 2C

US 9,057,744 B2

PROTECTIVE RELAYING DEVICE

CROSS-REFERENCE TO RELATED APPLICATIONS

This application is a Continuation Application of PCT Application No. PCT/JP2011/060160, filed Apr. 26, 2011 and based upon and claiming the benefit of priority from Japanese Patent Application No. 2010-123521, filed May 28, 2010, the entire contents of all of which are incorporated herein by reference.

FIELD

Embodiments described herein relate generally to a protective relaying device configured to exchange data between a plurality of protective relaying devices by using counter-transmission.

BACKGROUND

Along with progress in the digitization of protective relaying devices, protective relaying devices configured to carry out protection calculation by exchanging instantaneous values of electrical quantities sampled by a plurality of protective relaying devices between the devices by using counter-transmission are in wide use. A representative example of the above is a current differential protective relaying device for protection of an electric power transmission line.

In a general current differential protective relaying device, i.e., in each of protective relaying devices installed at both ends of an electric power transmission line, an instantaneous value of electrical quantity data sampled by each of the protective relaying devices arranged at both the terminals is cyclically transmitted to the protective relaying device at the opposite terminal at regular intervals of 30 electrical degrees, and two electrical quantity data items sampled at the same time are compared with each other, whereby calculation of obtaining a differential current is carried out.

A sampling synchronization control method of sampling electrical quantities at the same time is described in Jpn. Pat. Appln. KOKAI Publication No. 50-49645 (hereinafter referred to as "Pat. Document 1". FIG. 10 is a view showing the principle of the sampling synchronization control. Assuming that a time necessary for a first protective relaying device to receive data of a specific position on the transmission format of a second protective relaying device from a specific position (sampling timing 1) on the transmission format of the first protective relaying device is TM, a time necessary for the second protective relaying device to receive data of a specific position on the transmission format of the first protective relaying device from a specific position (sampling timing 2) on the transmission format of the second protective relaying device is TF, a transmission delay time of transmission (hereinafter referred to as "up-transmission") from the second protective relaying device to the first protective relaying device is Td1, a transmission delay time of transmission (hereinafter referred to as "down-transmission") from the first protective relaying device to the second protective relaying device is Td2, and a sampling timing synchronization error between the two protective relaying devices is ΔT, the relationships between TF, TM, and ΔT can be expressed by formula (1).

$$TM=Td1-\Delta T, TF=\Delta T+Td2 \text{ and thus}$$

$$\Delta T=(TF-TM+Td1-Td2)/2 \quad (1)$$

Further, TF and TM are measurable in the protective relaying device, and hence, assuming that the transmission delay times Td1 and Td2 are equal to each other because the same transmission route, and transmission device are used, the sampling timing is controlled such that a condition expressed by following formula (2) is obtained, whereby sampling operations at the same time are enabled (see for example, Pat. Document 1).

$$TF-TM=0 \quad (2)$$

Further, in a method of Jpn. Pat. Appln. KOKAI Publication No. 2007-68325 (hereinafter referred to as "Pat. Document 2", a concept that sampling synchronization is to be controlled by paying attention to the fact that a normal load current is a passing current, causes no phase difference between both ends, and a differential current becomes 0 is described.

In the sampling synchronizing system shown in Pat. Document 1, there is a precondition that the transmission delay time of the up-transmission and transmission delay time of the down-transmission must be equal to each other. Accordingly, in the prior art, the target value of "TF−TM" is generally set to "0" as shown by formula (2). However, in practice, even when the same transmission route and transmission device are applied to the up-transmission and down-transmission, variation in the transmission delay time between the up-transmission and down-transmission is caused, i.e., a difference is caused between the transmission delay time of the up-transmission, and transmission delay time of the down-transmission because of data buffering of the transmission device, transmission timing, and the like.

Although the variation in transmission delay time between the up-transmission and down-transmission generally leads to a certain transmission delay time after power-startup of the transmission device, there is the possibility of a transmission delay time difference occurring between the up-transmission and down-transmission and, even a case where the transmission delay time difference becomes about 200 μS is observed.

A sampling synchronization error ΔT is caused by the transmission delay time difference. In the case of a current differential protective relaying device, the sampling synchronization error ΔT appears as a differential current error with respect to the passing current I. The differential current error in the above-mentioned case where the transmission delay time difference is 200 μS becomes about 6% with respect to the passing current I, thereby hindering realization of a current differential relaying device with high sensitivity.

Further, although the method shown in Pat. Document 2 is theoretically possible, an actual technique to put it into practice is not mentioned, and there is thus a problem in synchronizing the sampling timings with high accuracy.

Under these circumstances, it is desired to provide a protective relaying device having a function of synchronizing sampling timings with each other with high accuracy even when there is a difference between the up-transmission delay time and down-transmission delay time in the method of controlling sampling synchronization by counter-transmission.

BRIEF DESCRIPTION OF THE DRAWINGS

FIG. 1 is a flowchart showing the configuration of embodiment 1;

FIG. 2A is a view showing a case where sampling timings are not synchronized with each other in the sampling timing control of embodiment 1;

FIG. 2B is a view showing a case where sampling timings are synchronized with each other in the sampling timing control of embodiment 1;

FIG. 2C is a view showing a case where the sampling synchronization error is made 0 in the sampling timing control of embodiment 1;

DETAILED DESCRIPTION

Embodiments will be described with reference to the drawings.

In general, according to one embodiment, there is provided a protective relaying device including a measuring unit configured to measure a time TM necessary for a first protective relaying device to receive data of a specific position on a transmission format of a second protective relaying device from a specific position on a transmission format of the first protective relaying device, and a time TF necessary for the second protective relaying device to receive data of a specific position on the transmission format of the first protective relaying device from a specific position on the transmission format of the second protective relaying device; a phase difference calculating unit configured to calculate a phase difference between a phase obtained by shifting a phase of first current data input to the first protective relaying device by 180°, and a phase of second current data input to the second protective relaying device; a setting unit configured to calculate a target value of elimination of a sampling synchronization error caused by a difference between a transmission delay time of up-transmission, and a transmission delay time of down-transmission on the basis of the phase difference calculated by the phase difference calculating unit, and to set the calculated target value as a target value of sampling synchronization control; and a sampling synchronization control unit configured to carry out control of sampling synchronization between the first protective relaying device, and the second protective relaying device such that a difference between the time TM, and the time TF which are measured by the measuring unit becomes the target value set by the setting unit.

Embodiment 1

Figure 10:
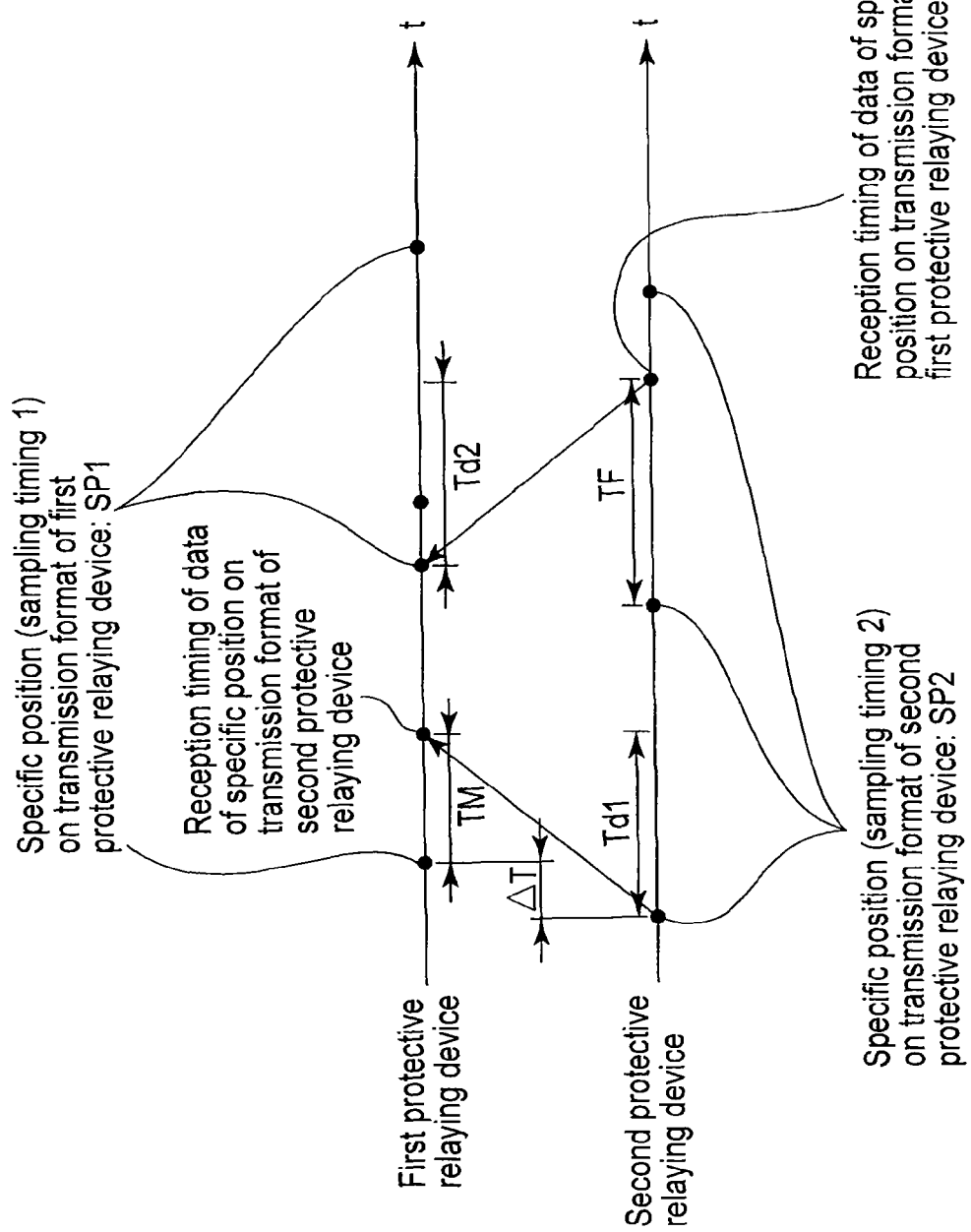
FIG. 10 is a view showing the principle of sampling synchronization control in a protective relaying device.

FIG. 1 is a flowchart showing the configuration of a protective relaying device of embodiment 1. The protective relaying device of embodiment 1 is provided with TF/TM measuring means 1, phase difference calculating means 2, setting means 3, and sampling synchronization control means 4 (hereinafter referred to as "SP synchronization control means 4"). It should be noted that the protective relaying devices of embodiment 1 refers to the above-mentioned first protective relaying device and second protective relaying device of FIG. 10.

The TF/TM measuring means 1 measures a time TM necessary for a first protective relaying device to receive data of a specific position on the transmission format of a second protective relaying device from a specific position SP1 (i.e., "sampling timing 1") on the transmission format of the first protective relaying device. Further, the TF/TM measuring means 1 measures a time TF necessary for the second protective relaying device to receive data of a specific position on the transmission format of the first protective relaying device from a specific position SP2 (i.e., "sampling timing 2") on the transmission format of the second protective relaying device.

The phase difference calculating means 2 acquires a current phase difference θ which is a phase difference between a phase obtained by shifting the phase of AC input current data of the first protective relaying device (own end) by 180°, and AC input data of the second protective relaying device (opponent end).

The setting means 3 calculates a target value K of (TF−TM) on the basis of the current phase difference θ calculated by the phase difference calculating means 2, and sets the calculated value.

The SP synchronization control means 4 carries out sampling synchronization (SP synchronization) control such that the difference between TF and TM becomes the target value K set by the setting means 3.

(Regarding the Target Value K of Sampling Synchronization)

The target value K used in the sampling synchronization of the SP synchronization control means 4 will be described below.

FIG. 2A shows a case where sampling timings of the first protective relaying device and second protective relaying device are not synchronized with each other, and the specific position SP2 (sampling timing 2) on the transmission format of the second protective relaying device is earlier in timing than the specific position SP1 (sampling timing 1) on the transmission format of the first protective relaying device. The relationships between the transmission delay time Td1 of the up-transmission, transmission delay time Td2 of the down-transmission, sampling synchronization error ΔT, and TF and TM at this time are expressed by aforementioned formula (1). Here, there is a difference between the transmission delay time Td1 of the up-transmission, and transmission delay time Td2 of the down-transmission.

In the state of FIG. 2A, synchronization control is carried out by the SP synchronization control means 4 such that TF−TM=0 is obtained. When there is a difference between the transmission delay time of the up-transmission, and transmission delay time of the down-transmission, if synchronization control is carried out such that TF−TM=0 is obtained, although the values of TF and TM become identical to each other, the specific position SP2 (sampling timing 2) on the transmission format of the second protective relaying device is shifted toward the later side from the specific position SP1 (sampling timing 1) on the transmission format of the first protective relaying device by the sampling synchronization error ΔT (i.e., the sampling timing of the second protective relaying device is delayed by the sampling synchronization error ΔT) as shown in FIG. 2B. As described above, when there is a difference between the transmission delay time of the up-transmission, and transmission delay time of the down-transmission, even by carrying out synchronization control to obtain TF−TM=0, the specific position SP1 (sampling timing 1) on the transmission format of the first protective relaying device, and specific position SP2 (sampling timing 2) on the transmission format of the second protective relaying device do not coincide with each other.

At this time, the sampling synchronization error ΔT becomes equal to a value obtained by dividing a difference (Td1−Td2) between the up-transmission delay time, and down-transmission delay time of the first protective relaying device, and second protective relaying device by 2. It should be noted that formula (3) is obtained by substituting "0" for "TF−TM" in formula (1).

$$\Delta T = (Td1-Td2)/2 \quad (3)$$

Here, Td1−Td2 indicates the difference between the up-transmission delay time, and down-transmission delay time of the first protective relaying device, and second protective relaying device.

On the other hand, when there is a difference between the transmission delay time of the up-transmission, and transmission delay time of the down-transmission, in order to make the specific position SP1 (sampling timing 1) on the transmission format of the first protective relaying device, and specific position SP2 (sampling timing 2) on the transmission format of the second protective relaying device coincide with each other, i.e., in order to make the sampling synchronization error ΔT "0" to achieve sampling synchronization, it is necessary to set the target value K of "TF−TM" used in the sampling synchronization to the value "Td2−Td1" obtained by formula (4).

Formula (4) is obtained by substituting "0" for the sampling synchronization error ΔT in formula (1).

$$TF-TM=Td2-Td1 \quad (4)$$

(Calculation Method of Target Value K)

Next, the calculation method of the target value K used in the sampling synchronization of the SP synchronization control means 4 will be described below.

From formula (3), formula (5) is obtained.

$$Td2-Td1=-2\Delta T \quad (5)$$

When the sampling synchronization is established, a difference between the phase of the current of the first protective relaying device (own end), and phase of the current of the second protective relaying device (opposite end) becomes 180°. That is, when the phase of the current of the first protective relaying device (own end) is assumed as a criterion (0°), if the phase of the current of the second protective relaying device (opposite end) is 180°, sampling synchronization is established.

Here, when the relationships between the phase difference θ (hereinafter referred to as "current phase difference θ") between the phase (hereinafter referred to as "180°-shifted phase of the current phase of the own end") obtained by shifting the phase of the current of the first protective relaying device (own end) by 180°, and phase of the current of the second protective relaying device (opposite end), and sampling synchronization error ΔT are to be shown, formula (6) is obtained.

$$\Delta T = \theta / 2\pi f \quad (6)$$

Here, θ indicates the current phase difference [radian], and f indicates the commercial frequency [Hz].

From formulae (4), (5), and (6), $$TF-TM=Td2-Td1=-2\Delta T=-2(\theta/2\pi f)=-\theta/\pi f$$

is obtained. As a result, the target value K used to control TF−TM can be obtained by formula (7). That is, the target value K is a value double the sampling synchronization error ΔT, and can be obtained from the current phase difference θ.

$$K=-\theta/\pi f \quad (7)$$

(Operation of Sampling Synchronization Control)

As described above, the TF/TM measuring means 1 measures TM and TF. The phase difference calculating means 2 obtains the phase difference current phase difference θ between the 180°-shifted phase of the current phase of the own end of the first protective relaying device, and phase of the current of the second protective relaying device. Further, the setting means 3 calculates the target value K by using formula (7) on the basis of the current phase difference θ obtained by the phase difference calculating means 2. Further, the setting means 3 sets the calculated target value K as the target value K of the sampling synchronization (SP synchronization) control of the SP synchronization control means 4. Further, the SP synchronization control means 4 carries out sampling synchronization control such that "TF−TM=K" is obtained on the basis of the target value K set by the setting means 3. Here, in actuality, the SP synchronization control means 4 carries out sampling synchronization control on the basis of a formula |TF−TM−K|≤ε. The character "ε" is a predetermined tolerance of the sampling synchronization control.

In this manner, the SP synchronization control means 4 carries out sampling synchronization control on the basis of the target value K calculated from the current phase difference θ, whereby accurate sampling synchronization in which the sampling synchronization error ΔT is made 0 as shown in FIG. 2C can be established.

According to this embodiment 1, even when there is a difference between the transmission delay time of the up-transmission, and transmission delay time of the down-transmission in the first protective relaying device, and second protective relaying device, the sampling synchronization can be established with high accuracy.

Embodiment 2

Embodiment 2 will be described below with reference to FIG. 3. Configurations identical to embodiment 1 are denoted by identical reference symbols, and a description of them is omitted.

Figure 3:
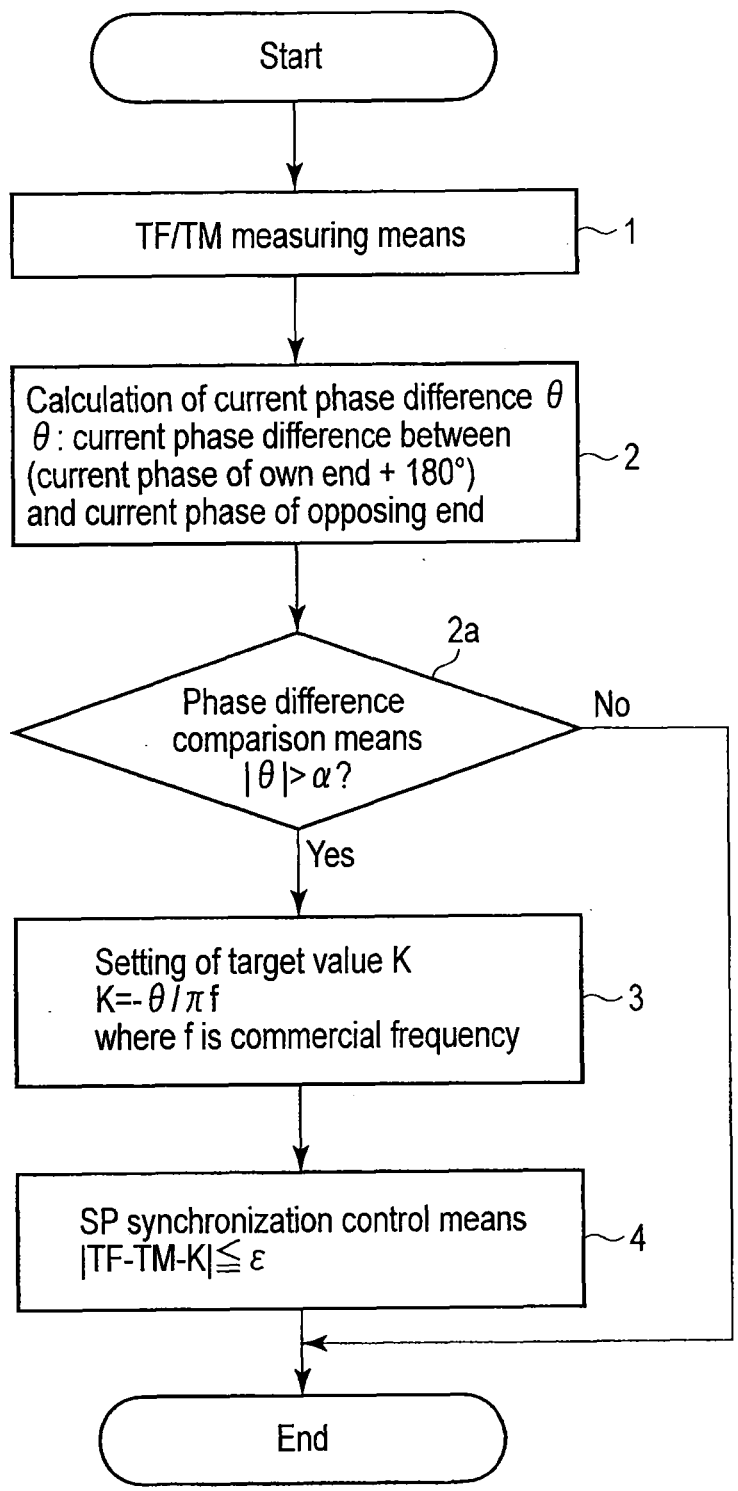
FIG. 3 is a flowchart showing the configuration of embodiment 2.

FIG. 3 is a flowchart showing the configuration of embodiment 2. What makes the configuration of embodiment 2 different from that of embodiment 1 is that phase difference comparison means 2a for comparing a phase difference θ calculated by phase difference calculating means 2, and a fixed value α with each other is provided between phase difference calculating means 2 and setting means 3.

Next, a function of the phase difference comparison means 2a which makes embodiment 2 configured as described above different from embodiment 1 will be described below.

Measurement of TF/TM is carried out by TF/TM measuring means 1, and calculation of a current phase difference θ is carried out by the phase difference calculating means 2 and, thereafter the phase difference comparison means 2a determines whether or not the current phase difference θ calculated by the phase difference calculating means 2 is greater than a fixed value α (e.g., 200 to 400 μS). As a result of the determination, when it is determined by the phase difference comparison means 2a that the current phase difference θ calculated by the phase difference calculating means 2 is greater than the fixed value α (Yes), the setting means 3 and SP synchronization control means 4 are enabled, and sampling synchronization control is carried out.

On the other hand, when it is determined by the phase difference comparison means 2a that the current phase difference θ is smaller than the fixed value α (No), the setting means is disabled, and the flow is terminated.

According to embodiment 2, it is possible to prevent correction of the sampling synchronization control from being frequently carried out, and obtain stable sampling synchronization control in addition to the advantage of embodiment 1.

It should be noted that when evaluation is carried out by the phase difference comparison means 2a by using a value obtained by converting the current phase difference θ into time too, the same advantage can be obtained.

Embodiment 3

Embodiment 3 will be described below with reference to FIG. 4. Configurations identical to embodiment 1 are denoted by identical reference symbols, and a description of them is omitted.

Figure 4:
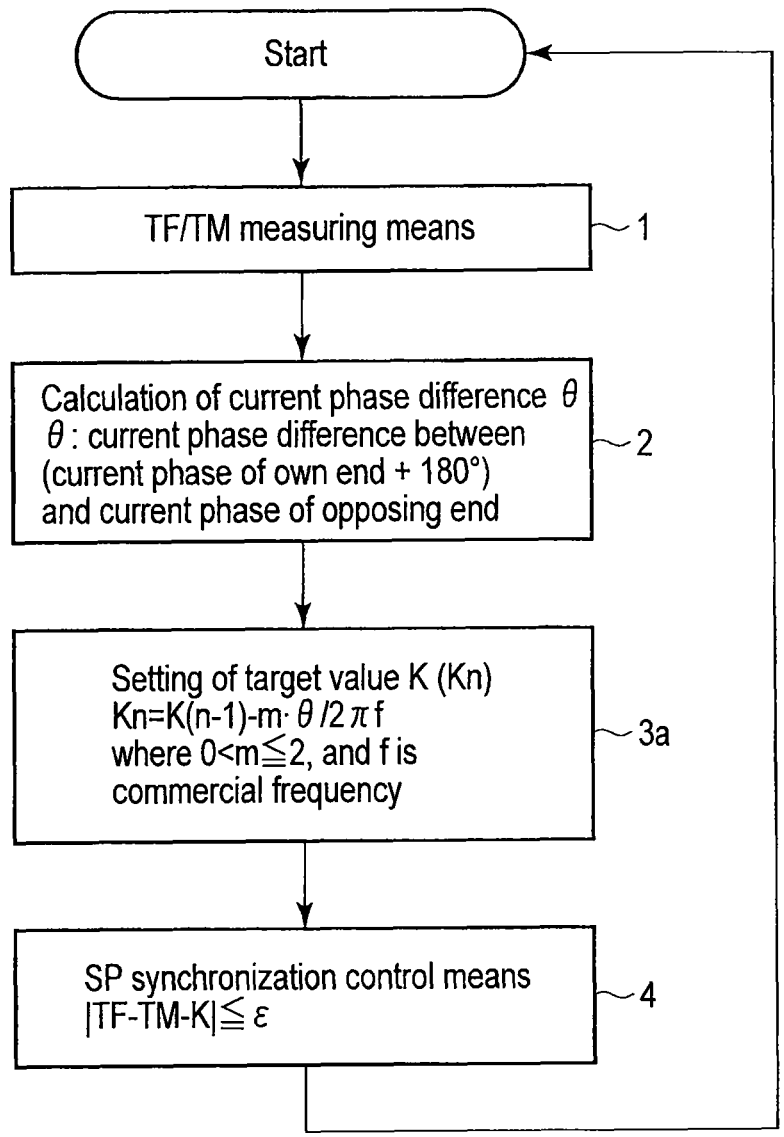
FIG. 4 is a flowchart showing the configuration of embodiment 3.

FIG. 4 is a flowchart showing the configuration of embodiment 3. What makes the configuration of embodiment 3 different from that of embodiment 1 is that setting means 3a is provided in place of the setting means 3 of embodiment 1 to thereby enable cyclic calculation (i.e., periodic calculation).

Measurement of TF/TM is carried out by TF/TM measuring means 1, and calculation of a current phase difference θ is carried out by phase difference calculating means 2 and, thereafter the setting means 3a calculates the newest value Kn of the target value K.

Regarding the newest value Kn of the target value K, the setting means 3a calculates the current phase difference θ obtained by phase difference calculating means 2 in terms of time, and adds a value obtained by multiplying the above time-calculated value by "−m" to the value K (n−1) obtained by the calculation of the last time, thereby calculating the newest value Kn of the target value K as indicated by formula (5).

$$Kn = K(n-1) - m \cdot \theta / 2\pi f \quad (5)$$

Here, θ indicates the current phase difference [radian], m is conditioned by 0<m≤2, and f indicates the commercial frequency [Hz].

As described above, the setting means 3 calculates the target value Kn by using formula (5), and sets the calculated target value Kn as the target value Kn of the sampling synchronization (SP synchronization) of the SP synchronization control means 4. Further, the SP synchronization control means 4 carries out sampling synchronization control on the basis of the target value Kn set by the setting means 3.

According to embodiment 3, the target value is not calculated and set only once, but is cyclically calculated and set (i.e., is periodically calculated and set), and hence sampling synchronization can be established at all times.

Embodiment 4

Embodiment 4 will be described below with reference to FIG. 5. Configurations identical to embodiment 1 are denoted by identical reference symbols, and a description of them is omitted.

Figure 5:
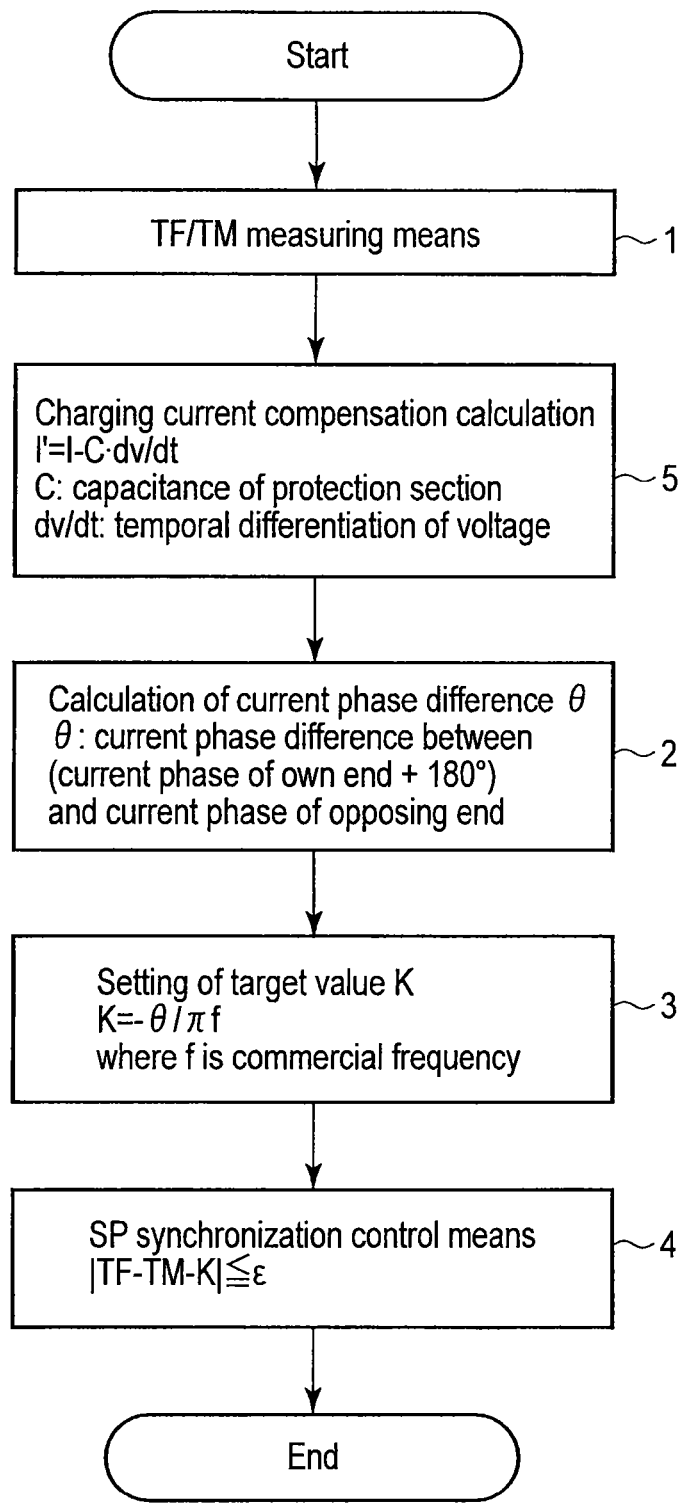
FIG. 5 is a flowchart showing the configuration of embodiment 4.

FIG. 5 is a flowchart showing the configuration of embodiment 4. What makes the configuration of embodiment 4 different from those of embodiments 1 and 2 is that charging current compensation means 5 for acquiring a current value obtained by subtracting (compensating) a charging current in the protection section from the original passing current is provided between TF/TM measuring means 1 and phase difference calculating means 2, and the phase difference calculating means 2 calculates a current phase difference θ by using the current value compensated by the charging current compensation means 5.

After measurement of TF/TM is carried out by the TF/TM measuring means 1, the charging current compensation means 5 calculates a current I' after charging current compensation.

The charging current compensation means 5 calculates the current I' after charging current compensation expressed by formula (6).

$$I' = I - C \cdot dv/dt \quad (6)$$

Here, C indicates the capacitance of a cable in the protection section, and dv/dt indicates temporal differentiation of the voltage.

In this manner, the phase difference calculating means 2 obtains the current phase difference θ by using the current value compensated by the charging current compensation means 5. Setting means 3 calculates a target value K by using the current phase difference θ calculated by using the compensated current value, and sets the calculated target value K as the target value K of sampling synchronization (SP synchronization) control of SP synchronization control means 4. Further, the SP synchronization control means 4 carries out the sampling synchronization control on the basis of the target value K set by the setting means 3.

According to embodiment 4, it is possible to obtain a current phase difference with high accuracy even when the charging current of the cable in the protection section is large, and hence it is possible to establish highly accurate sampling synchronization.

Embodiment 5

Embodiment 5 will be described below with reference to FIG. 6. Configurations identical to embodiment 1 are denoted by identical reference symbols, and a description of them is omitted.

Figure 6:
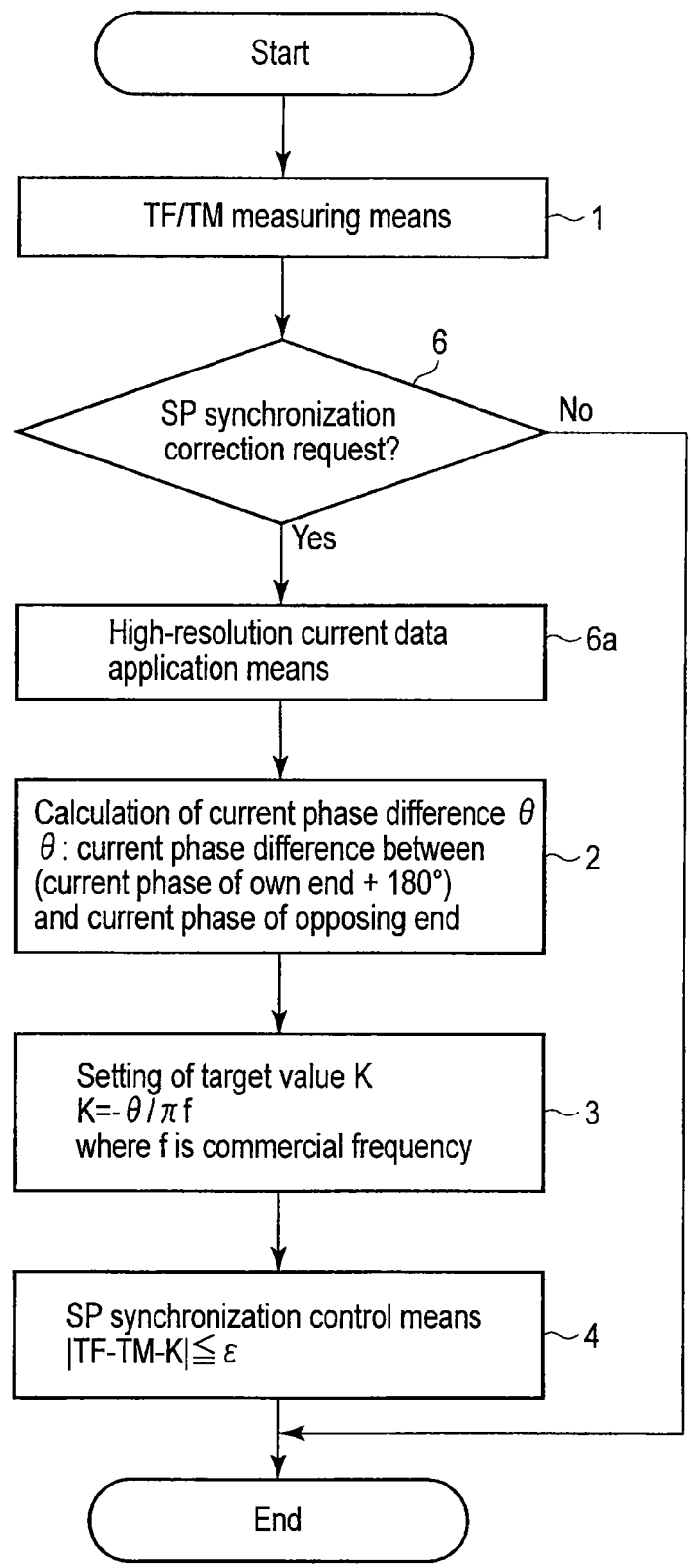
FIG. 6 is a flowchart showing the configuration of embodiment 5.

FIG. 6 is a flowchart showing the configuration of embodiment 5. What makes the configuration of embodiment 5 different from that of embodiment 1 is that SP synchronization correction request determination means 6 for determining whether or not there is a sampling synchronization (SP synchronization) correction request, and high-resolution current data application means 6a for applying data (hereinafter referred to as "high-resolution current data") in which resolution of the current is improved are provided between TF/TM measuring means 1, and phase difference calculating means 2.

After measurement of TF/TM is carried out by the TF/TM measuring means 1, the SP synchronization correction request determination means 6 determines whether or not there is an SP synchronization correction request.

It should be noted that here, the SP synchronization correction request for which it is determined by the SP synchronization correction request determination means 6 whether or not there is the request is set in advance by the operator such that the request is output at such time that, for example, a system fault rarely occurs and, a system in which when the specified time comes, an SP synchronization correction request is output from SP synchronization correction request output means (not shown) to the SP synchronization correction request determination means 6 may be employed or an SP synchronization correction request may be output from the SP synchronization correction request output means to the SP synchronization correction request determination means 6 in accordance with a manual operation carried out by the operator. Furthermore, outputting the SP synchronization correction request may be triggered by detection of SP synchronization failure.

The high-resolution current data application means 6a is enabled when it is determined by the SP synchronization correction request determination means 6 that there is an SP synchronization correction request (Yes). The high-resolution current data is data in which the full scale is approximately the rated load current. When it is determined by the SP synchronization correction request determination means 6 that there is an SP synchronization correction request (Yes), the high-resolution current data application means 6a acquires the high-resolution current data. The phase difference calculating means 2 uses the high-resolution current data acquired by the high-resolution current data application means 6a for calculation of the current phase difference θ.

Figure 7:
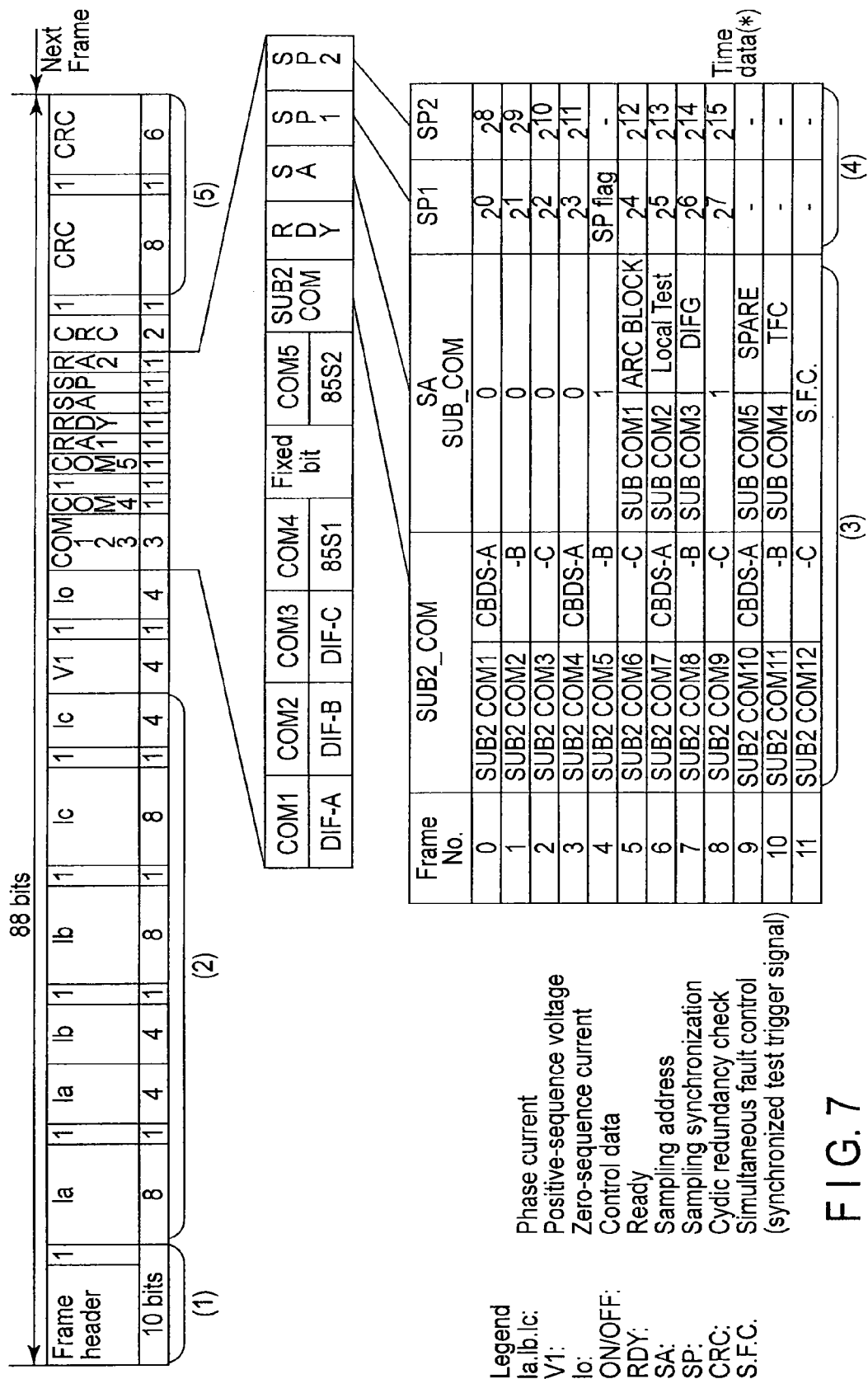
FIG. 7 is a view showing an example of a data format used for transmitting data in embodiment 5.

As an example of a method of transmitting the data in which the full scale is approximately the rated load current to the opponent end, it is also possible, in the data format of FIG. 7, to put high-resolution current data of the representative phase on the 4-bit part of IO. When the high-resolution data is transmitted on the basis of 12 bits, transmission of data of one sampling is achieved by three frames.

Further, by setting 1 to the corresponding bit by using the spare part of the SA SUB_COM bit in order to indicate that data is high-resolution current data, it becomes possible for the receiving side to determine whether or not the received data is high-resolution current data.

Next, functions of the SP synchronization correction request determination means 6 and high-resolution current data application means 6a which make embodiment 5 configured as described above different from embodiment 1 will be described below.

As described previously, when it is determined by the SP synchronization correction request determination means 6 that there is an SP synchronization correction request (Yes), the high-resolution current data application means 6a acquires the high-resolution current data. The phase difference calculating means 2 obtains a current phase difference θ by using the high-resolution current data acquired by the high-resolution current data application means 6a. Setting means 3 calculates a target value K by using the current phase difference θ calculated by using the high-resolution current data, and sets the calculated target value K as the target value K of the sampling synchronization (SP synchronization) control of the SP synchronization control means 4. Further, the SP synchronization control means 4 carries out sampling synchronization control on the basis of the target value K set by the setting means 3. On the other hand, when it is determined by the SP synchronization correction request determination means 6 that there is no SP synchronization correction request (No), the high-resolution current data application means 6a and all the subsequent means are disabled, and the flow is terminated.

According to this embodiment, it becomes possible, in addition to the advantage of embodiment 1, to carry out calculation of the current phase difference with high accuracy by using the high-resolution current data, and hence it is possible to establish a high degree of sampling synchronization.

Embodiment 6

Embodiment 6 will be described below with reference to FIG. 8. Configurations identical to embodiment 1 are denoted by identical reference symbols, and a description of them is omitted.

Figure 8:
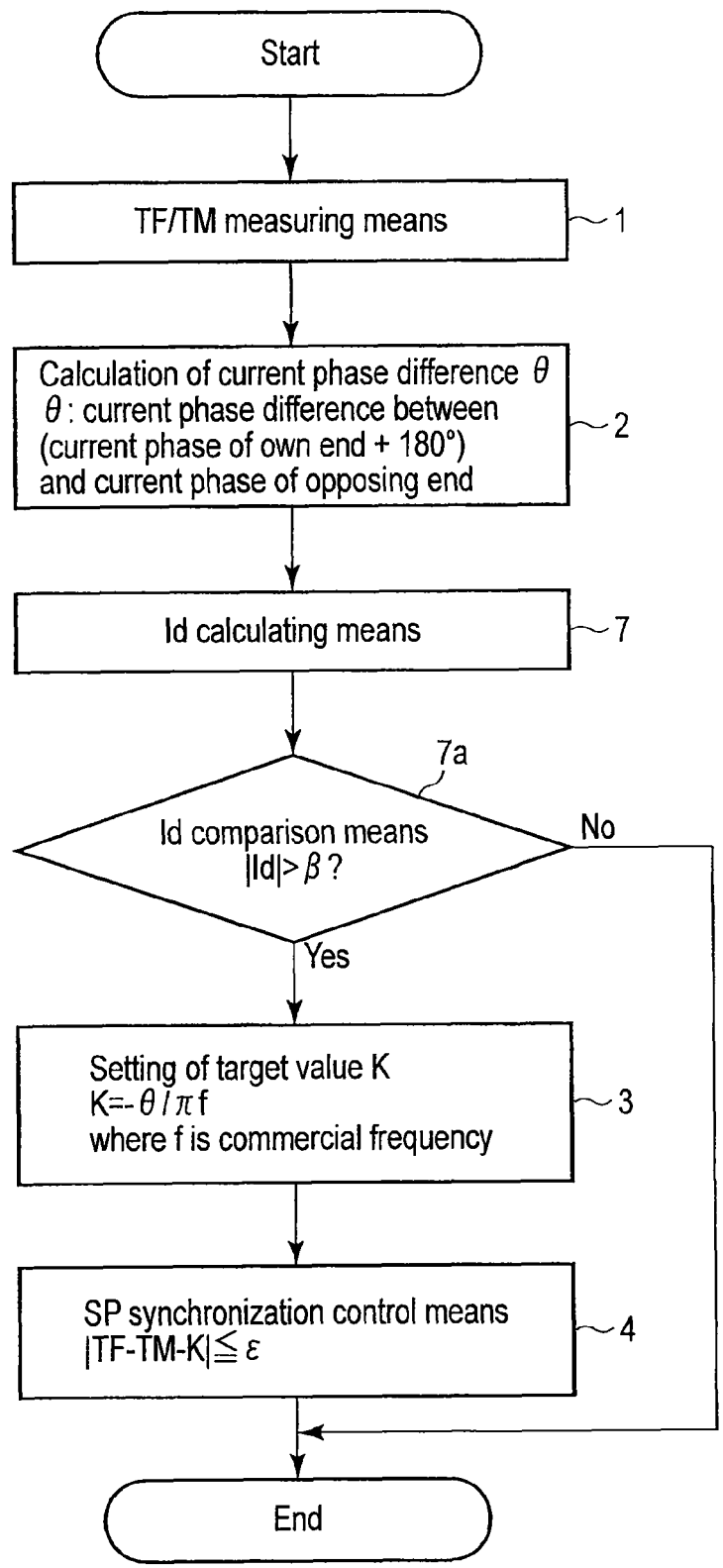
FIG. 8 is a flowchart showing the configuration of embodiment 6.

FIG. 8 is a flowchart showing the configuration of embodiment 6. What makes the configuration of embodiment 6 different from that of embodiment 1 is that differential current calculating means 7 (hereinafter referred to as "Id calculating means 7") for calculating a differential current Id between the own end and opposing end, and differential current comparison means 7a (hereinafter referred to as "Id comparison means 7a") for determining whether or not the differential current Id calculated by the Id calculating means 7 is greater than a fixed value β are provided between phase difference calculating means 2 and setting means 3.

Next, functions of the Id calculating means 7, and Id comparison means 7a of embodiment 6 configured as described above will be described below.

After measurement of TF/TM is carried out by TF/TM measuring means 1, and calculation of a current phase difference θ is carried out by phase difference calculating means 2, the Id calculating means 7 calculates a differential current Id between the first protective relaying device (own end), and second protective relaying device (opponent end). The Id comparison means 7a determines whether or not the differential current Id calculated by the Id calculating means 7 is greater than a fixed value β (e.g., 5 to 20% of the protective relay operation sensitivity Id). When it is determined by the Id comparison means 7a that the differential current Id is greater than the fixed value β (Yes), SP synchronization control means 4 and the setting means 3 are enabled, and sampling synchronization control is carried out. On the other hand, when it is determined by the Id comparison means 7a that the differential current Id is smaller than the fixed value β(No), the setting means 3 is disabled, and the flow is terminated. It should be noted that the order of executing the phase difference calculating means 2 is arbitrary; such as after the Id calculating means 7, after the Id comparison means 7a or the like provided the execution is before setting of the target value K.

According to embodiment 6, sampling synchronization control is carried out only when the differential current is large, and sampling synchronization control is not carried out when the differential current is small, and hence it is possible to prevent useless sampling synchronization control from being carried out.

Embodiment 7

Embodiment 7 will be described below with reference to FIG. 9. Configurations identical to embodiment 1 are denoted by identical reference symbols, and a description of them is omitted.

Figure 9:
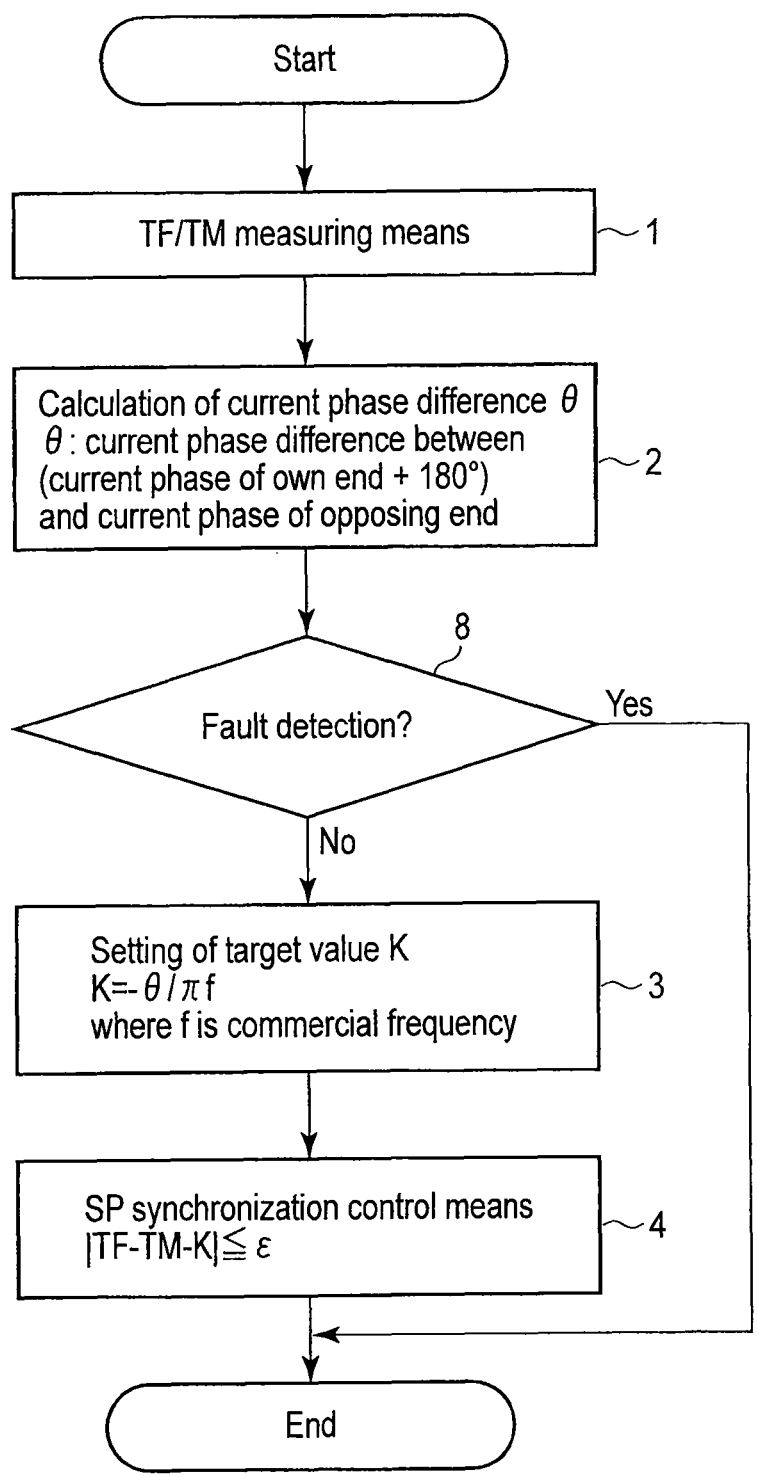
FIG. 9 is a flowchart showing the configuration of embodiment 7.

FIG. 9 is a flowchart showing the configuration of embodiment 7. What makes the configuration of embodiment 7 different from that of embodiment 1 is that fault detection determination means 8 is provided between phase difference calculating means 2 and setting means 3.

Next, a function of the fault detection determination means 8 which makes embodiment 7 configured as described above different from embodiment 1 will be described below.

After measurement of TF/TM is carried out by TF/TM measuring means 1, and calculation of a current phase difference θ is carried out by phase difference calculating means 2, the fault detection determination means 8 determines whether or not a fault is detected. When it is determined by the fault detection determination means 8 in this determination that no fault is detected (No), the setting means 3 and SP synchronization control means 4 are enabled, and sampling synchronization control is carried out. On the other hand, when it is determined by the fault detection determination means 8 that a fault is detected (Yes), operations of the setting means 3 and all the subsequent means are disabled, and the flow is terminated.

It should be noted that when it is determined by the fault detection determination means 8 that a fault is detected, the setting means 3 may be disabled for a given length of time and, furthermore, the setting means 3 may also be disabled until the fault is removed, and it is determined that the influence of the fault is eliminated.

It should be noted that the order of execution of the phase difference calculating means 2 is arbitrary; such as after the fault detection determination means 8 or the like provided the execution is before setting of the target value K.

It should be noted that although by the phase difference calculating means 2 in each of embodiments 1 to 7, a current phase difference has been calculated, a voltage phase difference may be calculated instead of the current phase difference. In this case, the setting means 3 calculates a setting value on the basis of a voltage phase difference calculated by the phase difference calculating means 2, and sets the calculated value.

As described above in detail, according to these embodiments, it is possible to provide a protective relaying device capable of synchronizing sampling timings with each other with high accuracy even when there is a difference between the transmission delay time of up-transmission, and transmission delay time of down-transmission in the method of controlling sampling synchronization by counter-transmission.

Although some embodiments of the present invention have been described above, these embodiments have been presented as examples, and are not intended to limit the scope of the invention. These embodiments can be implemented in various other forms, and various omissions, substitutions, and changes may be made without deviating from the gist of the invention. These embodiments and their modifications are included in the invention described in the claims and their equivalents, in the same manner in which they are included in the scope and gist of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A protective relaying device comprising:
    a measuring unit configured to measure a time TM necessary for a first protective relaying device to receive data of a specific position on a transmission format of a second protective relaying device from a specific position on a transmission format of the first protective relaying device, and a time TF necessary for the second protective relaying device to receive data of a specific position on the transmission format of the first protective relaying device from a specific position on the transmission format of the second protective relaying device;
    a phase difference calculating unit configured to calculate a phase difference between a phase obtained by shifting a phase of first current data input to the first protective relaying device by 180°, and a phase of second current data input to the second protective relaying device;
    a setting unit configured to calculate a target value of elimination of a sampling synchronization error caused by a difference between a transmission delay time of up-transmission, and a transmission delay time of down-transmission on the basis of the phase difference calculated by the phase difference calculating unit, and to set the calculated target value as a target value of sampling synchronization control; and
    a sampling synchronization control unit configured to carry out control of sampling synchronization between the first protective relaying device, and the second protective relaying device such that a difference between the time TM, and the time TF which are measured by the measuring unit becomes the target value set by the setting unit.

2. The protective relaying device according to claim 1, further comprising a phase difference comparison unit configured to determine whether or not an absolute value of the phase difference is greater than a predetermined value, wherein
    when it is determined by the phase difference comparison unit that the absolute value of the phase difference is greater than the predetermined value, the setting unit carries out calculation and setting of the target value, and the sampling synchronization control unit carries out sampling synchronization control based on the target value set by the setting unit.

3. The protective relaying device according to claim 1, wherein the setting unit carries out calculation of adding a value obtained by multiplying a value obtained by converting the phase difference into time by a real number greater than zero and smaller than or equal to 2 to the target value of the last time obtained by the calculation of the last time, and sets the value obtained by the calculation as the latest value of the target value.

4. The protective relaying device according to claim 1, wherein the phase difference calculating unit uses a current value obtained after subtraction of a charging current from a passing current in a protection section to calculate the phase difference.

5. The protective relaying device according to claim 1, wherein the phase difference calculating unit uses current data of improved resolution to calculate the phase difference.

6. The protective relaying device according to claim 1, further comprising:
    a differential current calculating unit configured to calculate a differential current between the first current data and the second current data; and
    a differential current comparison unit configured to determine whether or not a magnitude of the differential current calculated by the differential current calculating unit is greater than a predetermined value, wherein
    when it is determined by the differential current comparison unit that the magnitude of the differential current is greater than the predetermined value, the setting unit carries out calculation and setting of the target value, and the sampling synchronization control unit carries out sampling synchronization control based on the target value set by the setting unit.

7. The protective relaying device according to claim 1, further comprising a fault detection determination unit configured to determine whether or not there is a fault in the electric power system, wherein
    when it is determined by the fault detection determination unit that there is no fault, the setting unit carries out calculation and setting of the target value, and the sampling synchronization control unit carries out sampling synchronization control based on the target value set by the setting unit.

8. The protective relaying device according to claim 1, wherein the phase difference calculating unit calculates, as the phase difference, a phase difference between a phase obtained by shifting a phase of first voltage data input to the first protective relaying device by 180°, and a phase of second voltage data input to the second protective relaying device.

* * * * *